(12) United States Patent
Hirata et al.

(10) Patent No.: US 6,794,912 B2
(45) Date of Patent: Sep. 21, 2004

(54) MULTI-PHASE CLOCK TRANSMISSION CIRCUIT AND METHOD

(75) Inventors: Takashi Hirata, Osaka (JP); Toru Iwata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/361,610

(22) Filed: Feb. 11, 2003

(65) Prior Publication Data

US 2003/0155953 A1 Aug. 21, 2003

(30) Foreign Application Priority Data

Feb. 18, 2002 (JP) ........................................ 2002-040158

(51) Int. Cl.⁷ ................................................. H03D 3/24
(52) U.S. Cl. ........................................ 327/158; 327/161
(58) Field of Search ................................ 327/158, 161, 327/149, 153, 291, 295, 156, 261

(56) References Cited

U.S. PATENT DOCUMENTS 6,111,448 A * 8/2000 Shibayama ................. 327/293
6,353,648 B1 * 3/2002 Suzuki ....................... 375/376
6,492,851 B2 * 12/2002 Watarai ...................... 327/158

FOREIGN PATENT DOCUMENTS

JP         2-255908       10/1990

* cited by examiner

Primary Examiner—Dinh T. Le
(74) Attorney, Agent, or Firm—McDermott, Will & Emery LLP

(57) ABSTRACT

A multi-phase clock transmission circuit includes: a clock generator for generating a clock synchronizing with a reference clock and a control signal responsive to the phase difference between the reference clock and the generated clock; and a delay circuit for generating a multi-phase clock based on the clock and the control signal. The clock generator generates a signal having a frequency equal to an integral multiple of the frequency of the reference clock and outputs the signal as the clock. The delay circuit has a circuit receiving the clock and including a plurality of delay elements in cascade connection each giving a delay according to the control signal to an input signal. Signals output from the plurality of delay elements are used as signals constituting the multi-phase clock.

12 Claims, 15 Drawing Sheets

MULTI-PHASE CLOCK TRANSMISSION CIRCUIT AND METHOD

BACKGROUND OF THE INVENTION

The present invention relates to a technology of clock transmission in semiconductor integrated circuits.

In semiconductor integrated circuits, there are used in some cases a plurality of clocks that have the same frequency and retain a predetermined phase difference between the clocks. These clocks are collectively called a multi-phase clock. Conventionally, a multi-phase clock is generated and output by a clock generation circuit constructed of a phase locked loop (PLL) and the like. Clocks with different phases constituting a multi-phase clock are delivered to circuit blocks that require the multi-phase clock via transmission lines prepared exclusively for the respective clocks. One of such examples is disclosed in Japanese Laid-Open Patent Publication No.2-255908.

In the conventional multi-phase clock transmission method described above, in which multiple phase clocks are individually transmitted, m (m is an integer) lines are necessary for transmission of an m-phase clock. Therefore, as m is greater, a larger area is required for the transmission lines.

In general, as the distance of clock transmission is longer, the path length difference between the multiple phase clocks is greater, and also the influence of crosstalk with another signal line and the like is greater. As a result, the skew between the multiple phase clocks increases.

If the frequency of the multiple phase clocks is high, the proportion of the skew between the transmitted multiple phase clocks with respect to the clock period increases. In this event, the phase relationship between the multiple phase clocks may no more be secured in respective circuit blocks receiving the multi-phase clock, and this may cause malfunction of circuits.

SUMMARY OF THE INVENTION

An object of the present invention is providing a multi-clock transmission circuit and method in which the area for transmission lines required can be reduced and also the skew between multiple phase clocks can be reduced.

Specifically, the multi-phase clock transmission circuit of the present invention includes: a clock generator for generating a clock synchronizing with a reference clock and a control signal responsive to a phase difference between the reference clock and the clock and outputting the clock and the control signal; and a delay circuit for generating a multi-phase clock based on the clock and the control signal and outputting the multi-phase clock, wherein the clock generator comprises a clock generation circuit including a delay element for giving a delay according to the control signal to an input signal and outputting the resultant signal, the clock generation circuit generating a signal having a frequency equal to an integral multiple of a frequency of the reference clock and outputting the signal as the clock, and the delay circuit comprises a circuit receiving the clock and including a plurality of delay elements in cascade connection each giving a delay according to the control signal to an input signal and outputting the resultant signal, signals output from the plurality of delay elements being used as signals constituting the multi-phase clock.

According to the invention described above, only one clock is transmitted from the clock generator to the delay circuit, and the delay circuit generates a multi-phase clock. With this configuration, the number of transmission lines between the clock generator and the delay circuit can be reduced compared with the case that the clock generator generates a multi-phase clock and transmits the clock to the delay circuit. In addition, the phase difference between clocks constituting the multi-phase clock generated by the delay circuit can be kept constant irrespective of the length of the line for transmission of the clock. As a result, a circuit block having this delay circuit can use a multi-phase clock with reduced inter-block skew.

In the multi-phase clock transmission circuit described above, preferably, the clock generator further includes: a phase comparison circuit for comparing phases between the reference clock and the clock output from the clock generation circuit and outputting the comparison result; and a low-pass filter for outputting a low-frequency component of the comparison result as the control signal, wherein the clock generation circuit generates a signal having a frequency according to the control signal by oscillation and outputs the resultant signal, and the clock generation circuit, the phase comparison circuit and the low-pass filter constitute a phase locked loop (PLL).

With the above configuration, a multi-phase clock can be generated based on a clock synchronizing with the reference clock and having a stable frequency.

In the multi-phase clock transmission circuit described above, preferably, the clock generator further includes: a phase comparison circuit for comparing phases between the reference clock and the clock output from the clock generation circuit and outputting the comparison result; and a low-pass filter for outputting a low-frequency component of the comparison result as the control signal, wherein the clock generation circuit delays the reference clock in accordance with the control signal and outputs the resultant clock, and the clock generation circuit, the phase comparison circuit and the low-pass filter constitute a delay locked loop (DLL).

With the above configuration, a multi-phase clock can be generated based on a clock synchronizing with the reference clock and having the same frequency as the reference clock.

In the multi-phase clock transmission circuit described above, the delay element of the clock generation circuit and the plurality of delay elements of the delay circuit preferably have substantially the same configuration.

With the above configuration, the delay circuit can easily generate a signal substantially identical to the signal generated in the clock generator. In addition, with use of substantially the same delay elements, the design of the multi-phase clock generation circuit is simplified.

In the multi-phase clock transmission circuit described above, preferably, the clock is a differential signal, and the delay elements of the clock generation circuit and the delay circuit are differential buffers.

With the above configuration, the multi-phase clock can be obtained as a differential signal.

In the multi-phase clock transmission circuit described above, each of the plurality of delay elements of the delay circuit preferably controls the delay to be given to the input signal in accordance with a delay correction signal in addition to the control signal.

With the above configuration, the delay generated in each delay element of the delay circuit can be corrected with the delay correction signal. Therefore, by adjusting the delay to be equal to a delay generated in the delay element of the clock generation circuit, the phase difference between clocks constituting a multi-phase clock can be kept at a predetermined value. The power supply potential and the ground potential applied to the delay element of the clock generator may sometimes be different from those applied to the delay elements of the delay circuit in a circuit block depending on the positions of the components in an integrated circuit, for example. According to the present invention, even in such an event, the same delay can be generated in the delay elements of both the clock generator and the delay circuit.

Preferably, the delay circuit described above further includes a delay correction circuit receiving two signals among the signals output from the plurality of delay elements in cascade connection and the clock, for generating the delay correction signal in accordance with a difference between a phase difference between the received two signals and a predetermined value and outputting the delay correction signal.

With the above configuration, a delay generated in each delay element of the delay circuit can be automatically corrected in accordance with the phase difference between the two signals.

Preferably, the delay correction circuit outputs the delay correction signal as a digital signal.

With the delay correction signal being a digital signal, the configuration of the delay correction circuit can be simplified.

Preferably, the delay correction signal is input from outside a semiconductor integrated circuit including the multi-phase clock transmission circuit.

With the above configuration, a delay generated in each delay element of the delay circuit can be corrected easily for each chip from outside the semiconductor integrated circuit chip.

The multi-phase clock transmission circuit described above preferably further includes a buffer circuit corresponding to the delay circuit, wherein the buffer circuit changes the amplitude of the clock to a predetermined value and outputs the resultant clock to the corresponding delay circuit.

With the above configuration, a clock having a predetermined amplitude can be supplied to the delay circuit irrespective of the distance of transmission of the clock.

Preferably, the buffer circuit includes a delay element having substantially the same properties as the delay elements of the delay circuit.

With the above configuration, a clock output from the clock generator is supplied to the delay circuit as a signal having an amplitude substantially equal to that of the output signal of the delay element of the delay circuit. Therefore, the delays generated in the plurality of delay elements of the delay circuit can be made equal to each other, and thus the phase differences between the clocks constituting a multi-phase clock can be made equal to each other.

The multi-phase clock transmission circuit described above preferably further includes a buffer for changing the amplitude of an input signal to a predetermined value, the buffer being placed on a line for transmission of the clock at a position between a branch point for branching to the delay circuit and the clock generator.

With the above configuration, the amplitude of the clock transmitted can be kept at about a predetermined value.

Preferably, the buffer includes a delay element having substantially the same properties as the delay element of the clock generation circuit.

With the above configuration, the amplitude of the clock can be substantially kept at the amplitude of the signal output from the delay element of the clock generation circuit irrespective of the distance of transmission of the clock.

The multi-phase clock transmission circuit described above preferably further includes: an analog-digital conversion circuit for converting the control signal to a digital signal and outputting the resultant signal; and a digital-analog conversion circuit provided in correspondence with the delay circuit for converting the digitized transmitted control signal to an analog signal and outputting the resultant signal to the delay circuit.

With the above configuration, the control signal is prevented from changing during transmission to the delay circuit under influences of crosstalk and a variation of the power supply potential and the ground potential.

In the multi-phase clock transmission circuit described above, preferably, the delay circuit is provided in plural number, and the multi-phase clock transmission circuit further includes a plurality of phase interpolators placed in correspondence with the plurality of delay circuits, a line for transmission of the clock has a first portion from the clock generator to a turning point and a second portion from the turning point toward the clock generator, and has first and second branch points for branching to each of the phase interpolators in the first and second portions, respectively, each of the phase interpolators receives two signals via lines branching at the first and second branch points, changes the level of an output signal at substantially the midpoint between two timings at which the two signals respectively change the level, and outputs the resultant signal to the corresponding delay circuit as the clock, and the multi-phase clock transmission circuit is configured so that the times required for transmission of the signal through a line section between two adjacent branch points among the first branch points and a line section between the two branch points among the second branch points corresponding to the two adjacent first branch points are substantially equal to each other.

With the above configuration, the timings of clocks input into a plurality of delay circuits placed at some distance from each other can be made to match with each other. Therefore, a plurality of circuit blocks each having a delay circuit can use a multi-phase clock matching in timing.

The multi-phase clock transmission circuit described above preferably further includes a buffer or buffers of the same number on the line section between two adjacent first branch points and on the line section between the two second branch points corresponding to the two adjacent first branch points.

With the above configuration, the delay between two signals input into a phase interpolator is large. Therefore, the phase interpolator can easily generate an output signal of which the level changes at substantially the midpoint between the two timings at which the two signals respectively change the level.

Preferably, the length of the line section between two adjacent first branch points and the length of the line section between the two second branch points corresponding to the two adjacent first branch points are substantially equal to each other.

With the above configuration, the times required for transmission of a signal through the line section between two adjacent first branch points and through the line section between the two second branch points corresponding to the two adjacent first branch points can be made substantially equal to each other.

The multi-phase clock transmission method of the present invention includes the steps of: generating a clock synchronizing with a reference clock and a control signal responsive to a phase difference between the reference clock and the clock; and delaying a signal to obtain a multi-phase clock based on the clock and the control signal, wherein the step of generating a clock generates a signal having a frequency equal to an integral multiple of a frequency of the reference clock as the clock using a delay element for giving a delay according to the control signal to an input signal and outputting the resultant signal, and the step of delaying uses a circuit including a plurality of delay elements in cascade connection each giving a delay according to the control signal to an input signal and outputting the resultant signal, the circuit receiving the clock, and obtains signals output from the plurality of delay elements as signals constituting the multi-phase clock.

DESCRIPTION OF THE PREFERRED EMBODIMENTS

Hereinafter, preferred embodiments of the present invention will be described with reference to the accompanying drawings.

Embodiment 1

Figure 1:
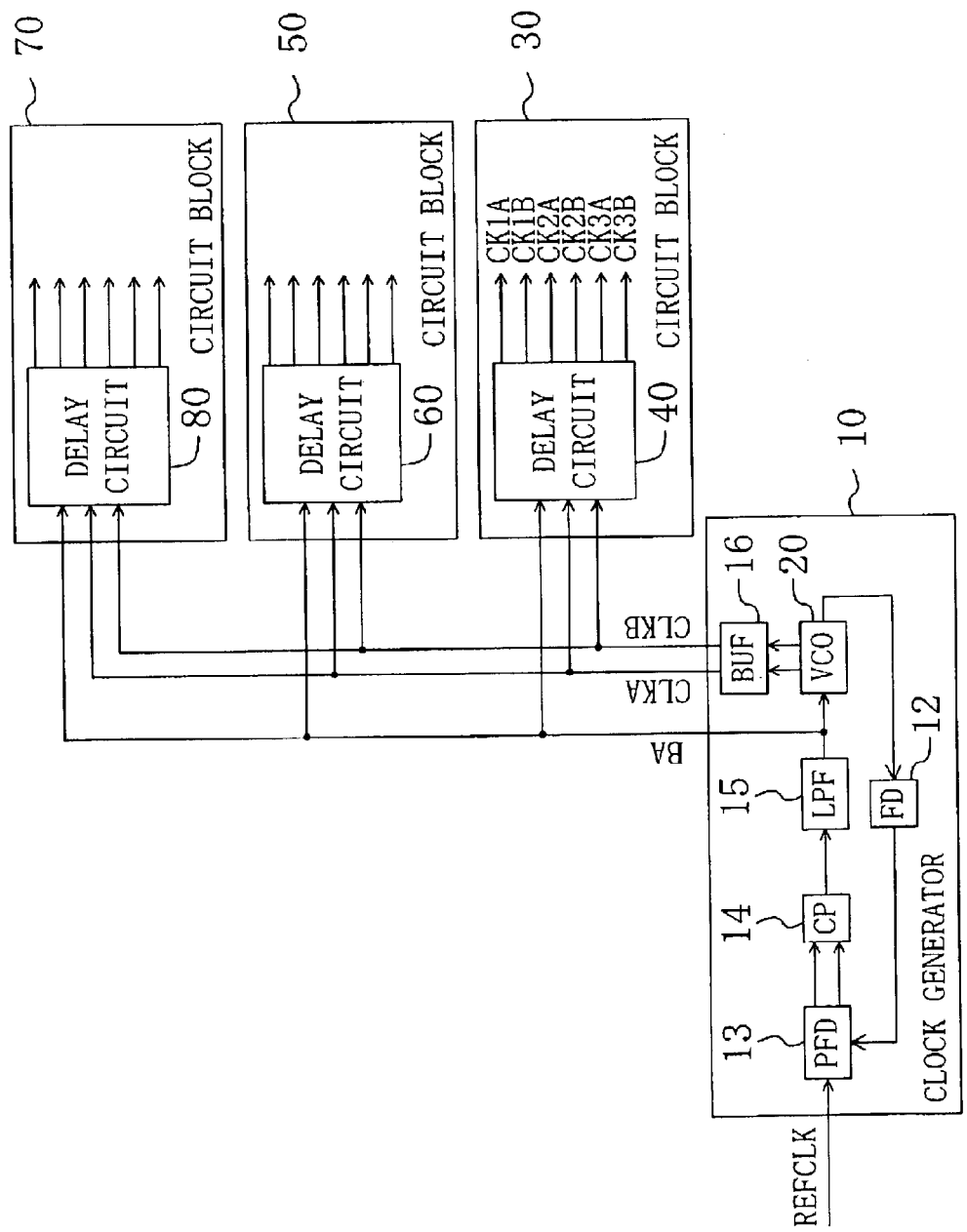
FIG. 1 is a block diagram of a semiconductor integrated circuit having a multi-phase clock transmission circuit of Embodiment 1 of the present invention.

FIG. 1 is a block diagram of a semiconductor integrated circuit having a multi-phase clock transmission circuit of Embodiment 1 of the present invention. Referring to FIG. 1, the multi-phase clock transmission circuit includes a clock generator 10 and delay circuits 40, 60 and 80. The delay circuits 40, 60 and 80 are respectively included in circuit blocks 30, 50 and 70 that individually perform signal processing and the like using a multi-phase clock.

The clock generator 10 includes a frequency divider (FD) 12, a phase frequency detector (PFD) 13, a charge pump (CP) 14, a low-pass filter (LPF) 15, a buffer (BUF) 16, and a voltage controlled oscillator (VCO) 20 as a clock generation circuit. The phase frequency detector 13 and the charge pump 14 operate as a phase comparison circuit. The phase frequency detector 13, the charge pump 14, the low-pass filter 15 and the VCO 20 of the clock generator 10 constitute a phase locked loop (PLL).

The frequency divider 12 divides the frequency of a signal output from the VCO 20 and outputs the result to the phase frequency detector 13. The phase frequency detector 13 compares phases between the output from the frequency divider 12 and an input reference clock REFCLK, and outputs a signal responsive to the resultant phase difference to the charge pump 14. The charge pump 14 outputs a voltage responsive to the phase difference to the low-pass filter 15 as the result of comparison by the phase comparison circuit. The low-pass filter 15 outputs the low-frequency component of the input voltage to the VCO 20 as a control signal BA.

The VCO 20, which includes a plurality of delay elements connected in a ring shape, outputs a signal having a period substantially equal to an integral multiple of a delay generated in one delay element. The VCO 20 controls the delay generated in each delay element with the control signal BA, generates a signal having a frequency according to the control signal BA, and outputs the resultant signal to the frequency divider 12 and the buffer 16. The signal output from the VCO 20 to the buffer 16 is a differential signal.

As described above, the clock generator 10 changes the control signal BA so that the frequency and phase of the signal obtained by frequency-dividing the output signal from the VCO 20 match with those of the reference clock REFCLK, to thereby achieve feedback control of the VCO 20. In this way, the clock generator 10 generates a signal having a frequency equal to an integral multiple of the frequency of the reference clock REFCLK.

The buffer 16 outputs the differential signal received from the VCO 20 to the delay circuits 40, 60 and 80. This differential signal output from the buffer 16, composed of signals CLKA and CLKB, is herein called a clock CLKA/CLKB. The low-pass filter 15 outputs the control signal BA also to the delay circuits 40, 60 and 80.

Figure 2:
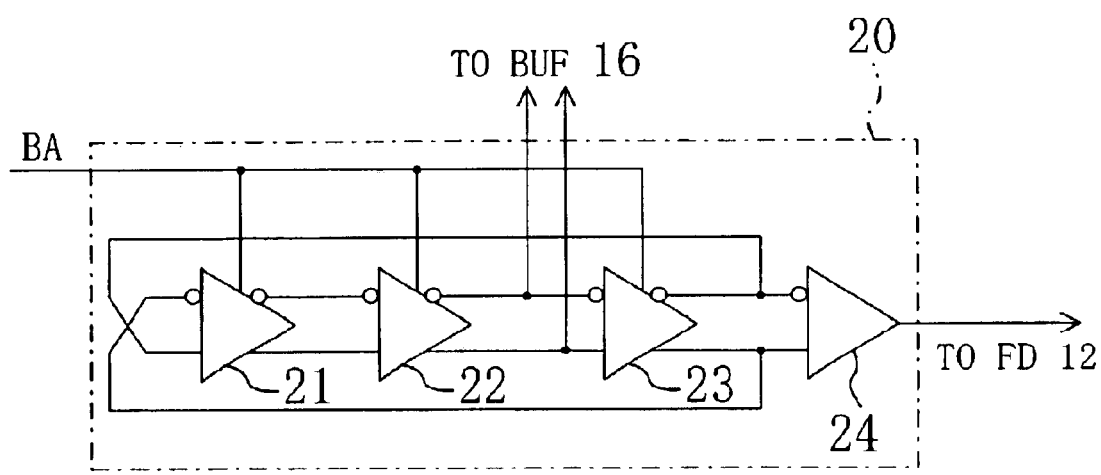
FIG. 2 is a circuit diagram of an example of a VCO in FIG. 1.

FIG. 2 is a circuit diagram of an example of the VCO 20 shown in FIG. 1. The VCO 20 includes delay elements 21, 22 and 23 and a buffer 24. The delay elements 21 to 23 are substantially identical to each other, and individually receive the control signal BA. For example, the delay elements 21 to 23 are differential buffers each having a positive input terminal, a negative input terminal, a positive output terminal and a negative output terminal.

The delay element 21 gives a delay according to the control signal BA to signals input at the positive and negative input terminals, and outputs the delayed signals to the delay element 22 from the positive and negative output terminals. The positive and negative output terminals of the delay element 21 are connected to the positive and negative input terminals, respectively, of the delay element 22.

Likewise, the delay elements 22 and 23 give a delay according to the control signal BA to input signals and output the delayed signals. The positive and negative output terminals of the delay element 22 are connected to the positive and negative input terminals, respectively, of the delay element 23. The positive and negative output terminals of the delay element 23 are connected to the negative and positive input terminals, respectively, of the delay element 21. The delay element 23 also supplies the output signals to the buffer 24, which converts the received differential signal to a single-ended signal and outputs the signal to the frequency divider 12.

The two signals output from the delay element 21 are opposite in phase to each other. This also applies to the signals output from the delay elements 22 and 23. The ring-shaped connection of the delay elements 21 to 23 as shown in FIG. 2 enables oscillation of the VCO 20. Each of the delay elements 21 to 23 outputs the differential signal having a period TCLK roughly six times as long as the delay generated by one of the delay elements 21 to 23.

The differential signals output from the delay elements 21 to 23, having a fixed phase difference from one another, can be used as a 3-phase clock. Herein, however, only the differential signal output from the delay element 22 is supplied as a clock via the buffer 16. The buffer 16, which is a complementary metal oxide semiconductor (CMOS), for example, outputs the received clock to the delay circuits 40, 60 and 80 as the clock CLKA/CLKB.

Figure 3:
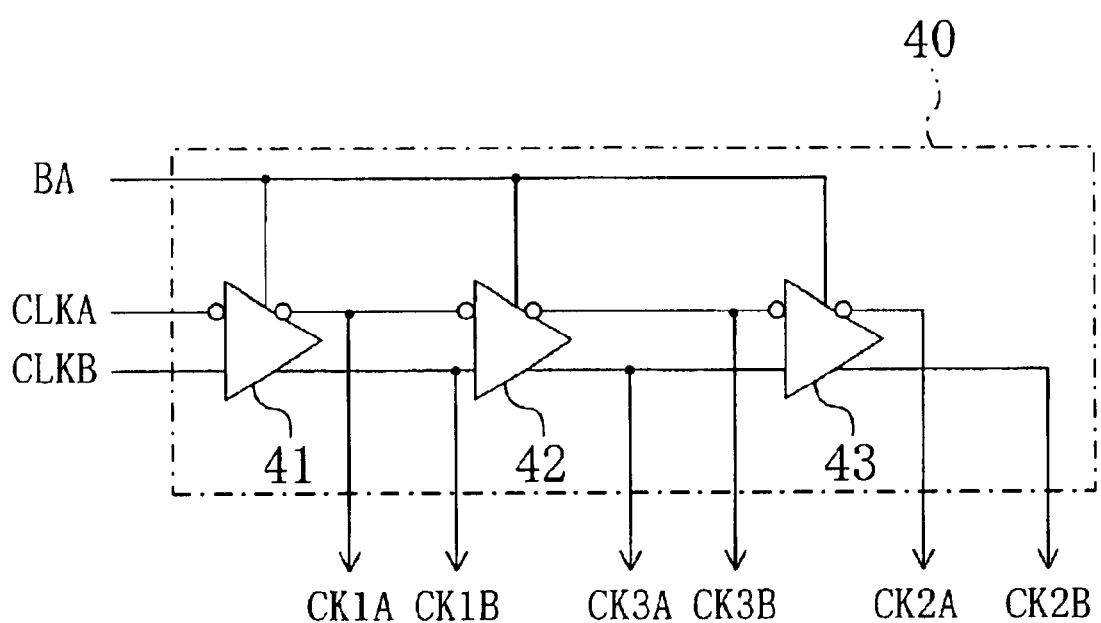
FIG. 3 is a circuit diagram of an example of a delay circuit in FIG. 1.

FIG. 3 is a circuit diagram of an example of the delay circuit 40 included in the circuit block 30 shown in FIG. 1. Hereinafter, the circuit block 30 will be used in description of the delay circuit as an example. Note however that the description also applies to the other circuit blocks 50 and 70 having substantially the identical delay circuit.

The delay circuit 40 includes delay elements 41, 42 and 43, all of which have substantially the same configuration as the delay elements 21 to 23 of the VCO 20, for example, and individually receive the control signal BA. The delay elements 41 to 43 are in cascade connection. That is, the positive and negative output terminals of the delay element 41 are connected to the positive and negative input terminals, respectively, of the delay element 42. The positive and negative output terminals of the delay element 42 are connected to the positive and negative input terminals, respectively, of the delay element 43.

The signal CLKA is input into the negative input terminal of the delay element 41 while the signal CLKB is input into the positive input terminal thereof. The delay element 41 gives a delay according to the control signal BA to these signals and outputs signals CK1A and CK1B. The differential signal composed of the signals CK1A and CK1B, which is herein called a clock CK1A/CK1B, is used as one clock constituting a multi-phase clock. Likewise, a differential signal composed of signals CK3A and CK3B output from the delay element 42, which is called a clock CK3A/CK3B, is used as another clock constituting the multi-phase clock. A differential signal composed of signals CK2A and CK2B output from the delay element 43, which is called a clock CK2A/CK2B, is used as yet another clock constituting the multi-phase clock.

The signals CK1A, CK3B and CK2A are signals output from the negative output terminals of the delay elements 41, 42 and 43, respectively, and the signals CK1B, CK3A and CK2B are signals output from the positive output terminals of the delay elements 41, 42 and 43, respectively. The delay elements 41 to 43 output these clocks to circuits in the circuit block 30.

Figure 4:
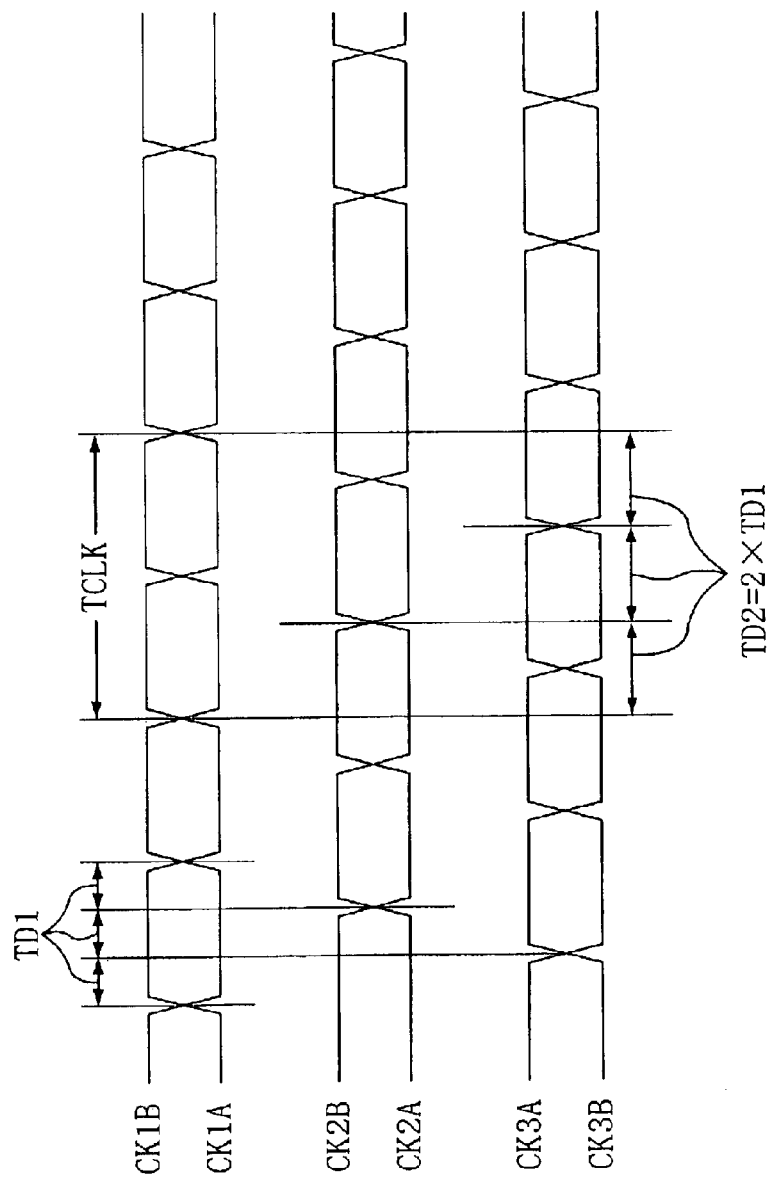
FIG. 4 is a timing chart of clocks output from the delay circuit in FIG. 1.

FIG. 4 is a timing chart of the clocks output from the delay circuit 40 in FIG. 1. A delay TD1 generated in each of the delay elements 41 to 43 is one-sixth of the period TCLK of the clock CLKA/CLKB, as in the delay elements 21 to 23. Therefore, the time difference TD2 between the clocks CK1A/CK1B and CK2A/CK2B is one-third of the period TCLK.

The signal CK3A is output from the positive output terminal of the delay element 42, not from the negative output terminal thereof. Therefore, the time difference between the clocks CK2A/CK2B and CK3A/CK3B and the time difference between the clocks CK3A/CK3B and CK1A/CK1B are also one-third of the period TCLK. That is, the phase differences among the clocks output from the delay elements 41 to 43 are all $2\pi/3$. The proportions of the delay TD1 and the time difference TD2 with respect to the period TCLK are determined with the number of delay elements in the ring-shaped connection of the VCO 20.

As described above, by use of the multi-phase clock transmission circuit of FIG. 1, a 3-phase clock can be obtained in the circuit block 30. The inter-clock phase difference is substantially the same as the 3-phase clock obtained in the clock generator 10. In other words, the 3-phase clock was successfully transmitted to the circuit block 30 with the frequency and the inter-clock phase difference retained substantially completely. The other circuit block 50 and the like having the delay circuit identical to the delay circuit 40 can also obtain a 3-phase clock in the same manner. In addition, even in the cases that the line for transmission of a clock is long and that the clock frequency is high, a multi-phase clock can be delivered to a plurality of circuit blocks with the clock frequency and the inter-clock phase difference kept constant.

It is easy to provide the delay elements 41 to 43 of the delay circuit 40 with substantially the same properties as those of the delay elements 21 to 23 of the VCO 20 as long as these delay elements are in the same semiconductor integrated circuit.

In this embodiment, the delay elements 41 to 43 have substantially the same configuration as the delay elements 21 to 23 of the VCO 20. Alternatively, delay elements having a different configuration may be used as long as these delay elements can provide substantially the same delay as that provided by the delay elements 21 to 23.

The number n (n is an integer) of delay elements of the VCO 20, as well as the number of delay elements of the delay circuit 40 and the like, may be changed, to generate a multi-phase clock composed of clocks of which phases are shifted by ½n of the clock period TCLK. To generate a multi-phase clock having a larger number of phases, a phase interpolation circuit may be used to generate a signal of which the phase is somewhere between any two clocks.

If the control signal can be supplied appropriately so that the VCO 20 outputs a clock having a desired frequency, the clock generator 10 is not necessarily provided with the phase locked loop.

(First Alteration to Embodiment 1)

Figure 5:
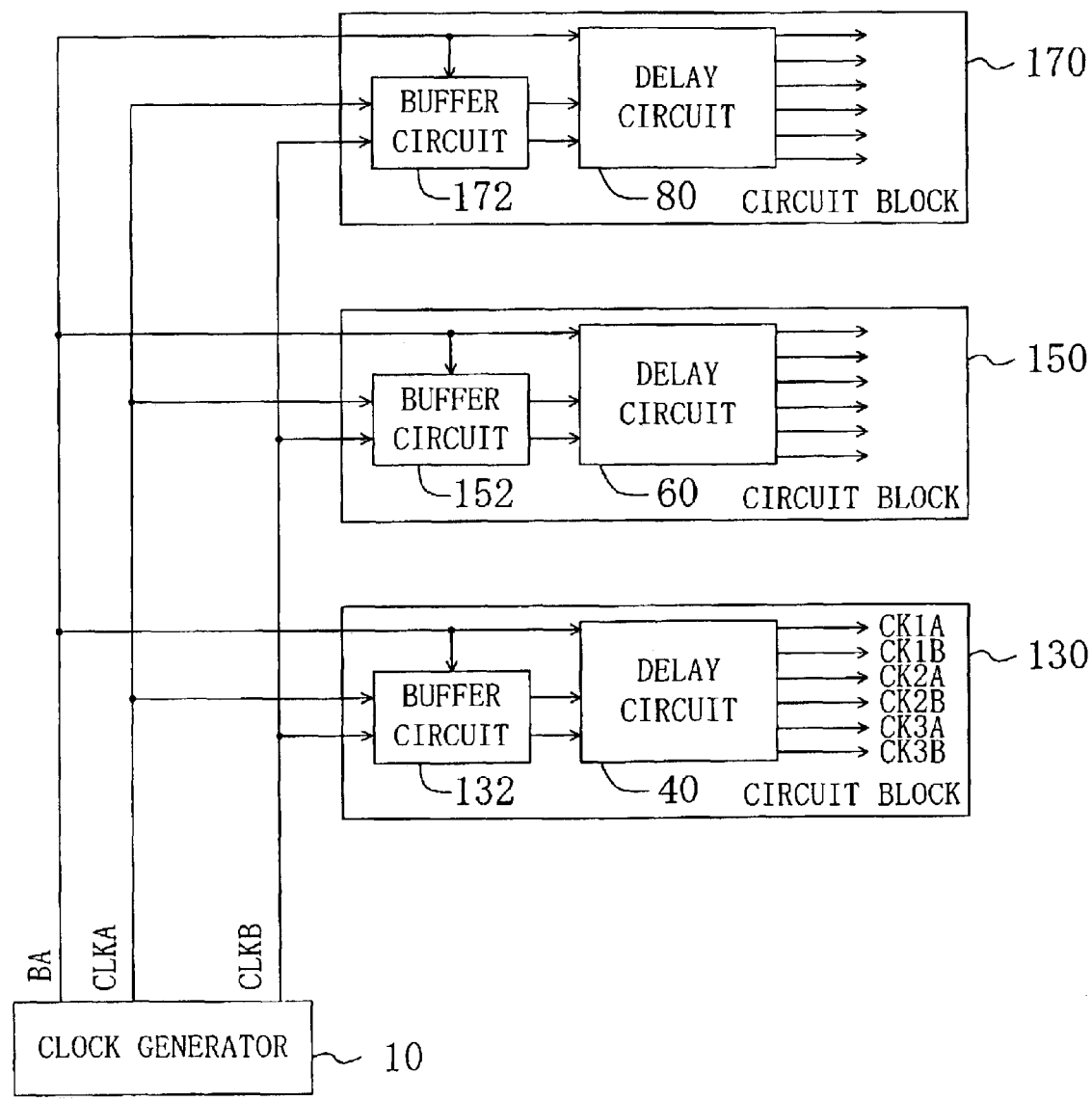
FIG. 5 is a block diagram of a semiconductor integrated circuit having a multi-phase clock transmission circuit of a first alteration to Embodiment 1 of the present invention.

FIG. 5 is a block diagram of a semiconductor integrated circuit having a multi-phase clock transmission circuit of the first alteration to Embodiment 1. The semiconductor integrated circuit of FIG. 5 includes circuit blocks 130, 150 and 170, in place of the circuit blocks 30, 50 and 70 of the semiconductor integrated circuit of FIG. 1.

Figure 6:
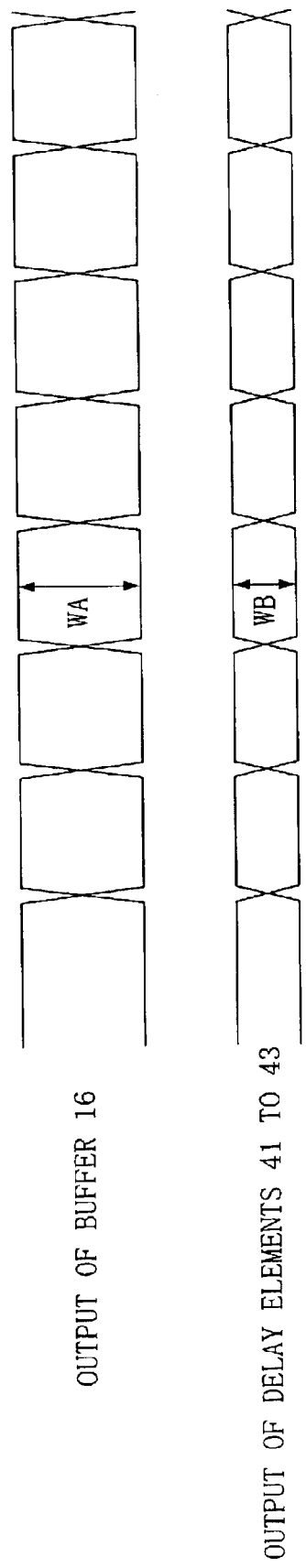
FIG. 6 is a graph showing examples of the amplitudes of a signal output from a buffer of a clock generator and a signal output from a delay circuit in FIG. 5.

FIG. 6 is a graph showing examples of the amplitudes of signals output from the buffer 16 of the clock generator 10 and signals output from the delay elements 41 to 43 of the delay circuit 40 shown in FIG. 5. Assume herein that the buffer 16 of the clock generator 10 is a CMOS logic circuit. In general, input/output signals of a delay element are different in voltage range from input/output signals of a CMOS logic circuit. When the power supply voltage applied to the buffer 16 is equal to that applied to the delay elements 41 to 43, the amplitude WB of the output signals of the delay elements 41 to 43 is smaller than the amplitude WA of the output signals of the buffer 16.

If the output signals CLKA and CLKB of the buffer 16 are directly input into the delay circuit 40, the amplitude of the output signals of the first-stage delay element 41 and the delay generated in the delay element 41 will be different from those obtainable in an idealistic case in which signals in substantially the same voltage range as the input/output signals of the delay elements 41 to 43 are input into the delay circuit 40. If such differences occur, the timing at which the signal level of the clock CK1A/CK1B output from the delay element 41 changes will be different from that in the idealistic case. This phenomenon may also occur in the second-stage delay element 42 and the third-stage delay element 43. As a result, it may be no more possible to provide the phase difference $2\pi/3$ among the clocks output from the delay elements 41 to 43.

To avoid the problem described above, as shown in FIG. 5, the circuit block 130 additionally includes a buffer circuit 132 in correspondence with the delay circuit 40. The buffer circuit 132 changes the amplitude of received signals to a predetermined value and outputs the resultant signals. The signals CLKA and CLKB output from the buffer 16 are input into the buffer circuit 132 before being supplied to the delay circuit 40.

Figure 7:
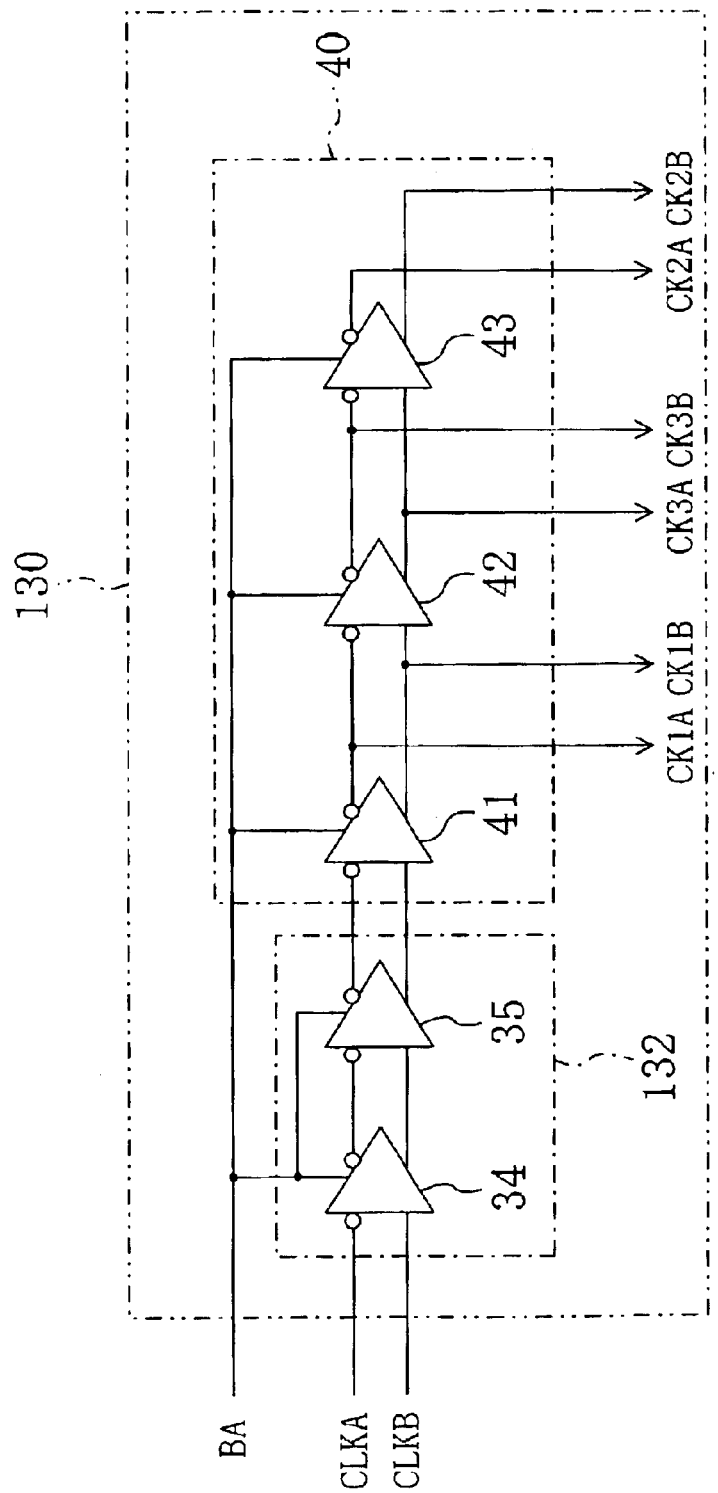
FIG. 7 is a circuit diagram of an example of a circuit block in FIG. 5.

FIG. 7 is a circuit diagram of an example of the circuit block 130 shown in FIG. 5. The buffer circuit 132 includes delay elements 34 and 35 having substantially the same properties as the delay elements 41 to 43 of the delay circuit 40. The delay elements 34 and 35 individually receive the control signal BA. The delay element 34 changes the amplitude of the input signals CLKA and CLKB to be close to the amplitude WB and outputs the resultant signals to the delay element 35. Likewise, the delay element 35 changes the amplitude of the input signals to be further close to the amplitude WB and outputs the resultant signals to the delay element 41.

The amplitude of the signals output from the delay element 35 has become substantially equal to that of the signals output from the delay elements 41 to 43; Thus, by providing the buffer circuit 132, the delay circuit 40 can output a 3-phase clock having an inter-clock phase difference of $2\pi/3$ although the amplitude WA of the signals CLKA and CLKB is different from the amplitude WB of the signals output from the delay elements 41 to 43.

The circuit blocks 150 and 170 also additionally include buffer circuits 152 and 172 in correspondence with the delay circuits 60 and 80, respectively. The configuration and operation of the circuit blocks 150 and 170 are substantially the same as those of the circuit block 130, and thus the description thereof is omitted here.

(Second Alteration to Embodiment 1)

Figure 8:
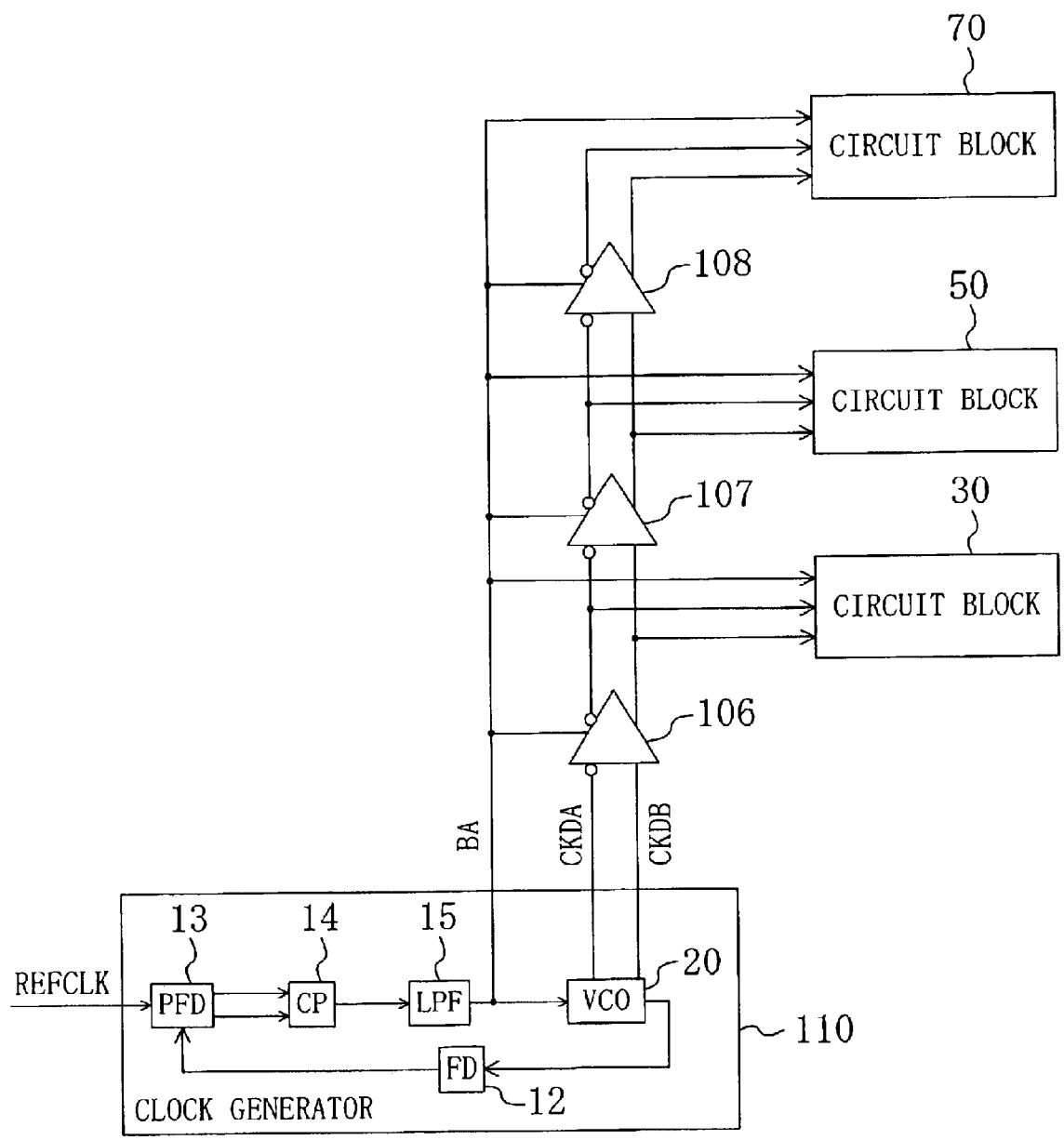
FIG. 8 is a block diagram of a semiconductor integrated circuit having a multi-phase clock transmission circuit of a second alteration to Embodiment 1 of the present invention.

FIG. 8 is a block diagram of a semiconductor integrated circuit having a multi-phase clock circuit of the second alteration to Embodiment 1. The semiconductor integrated circuit of FIG. 8 is different from the semiconductor integrated circuit of FIG. 1 in that a clock generator 110 is provided in place of the clock generator 10 and buffers 106, 107 and 108 are additionally provided. The clock generator 110 is different from the clock generator 10 in FIG. 1 in that the buffer 16 is omitted and the VCO 20 outputs a clock CKDA/CKDB as a differential signal. The buffers 106 to 108 have substantially the same properties as the delay element 21 of the VCO 20 and the like.

The two lines for transmitting the clock CKDA/CKDB output from the clock generator 110 have a branch point for branching to the delay circuit 40 in the circuit block 30 and a branch point for branching to the delay circuit 60 in the circuit block 50. The buffer 106, placed between the branch point to the delay circuit 40 and the clock generator 110, receives the signals CKDA and CKDB, changes the amplitude of these signals to a predetermined value, and outputs the resultant signals. The buffer 107, placed between the branch point to the delay circuit 60 and the branch point to the delay circuit 40, receives the signals output from the buffer 106, changes the amplitude of these signals to a predetermined value, and outputs the resultant signals. The buffer 108, placed between the delay circuit 80 in the circuit block 70 and the branch point to the delay circuit 60, receives the signals output from the buffer 107, changes the amplitude of these signals to a predetermined value, and outputs the resultant signals.

The amplitude of the signals output from the buffers 106 to 108 is substantially equal to that of the signals CKDA and CKDB output from the clock generator 110. Therefore, even if the distance between the clock generator 110 and any of the circuit blocks 30, 50 and 70 is long, it is possible to provide signals having substantially the same amplitude as the output of the clock generator 110 to the delay circuits in the circuit blocks.

The amplitude of the signals output from the buffers 106 to 108 may possibly be different from that of the signals CKDA and CKDB depending on the line connected and the load. This problem however can be prevented by adjusting the gains of the buffers 106 to 108.

(Third Alteration to Embodiment 1)

Figure 9:
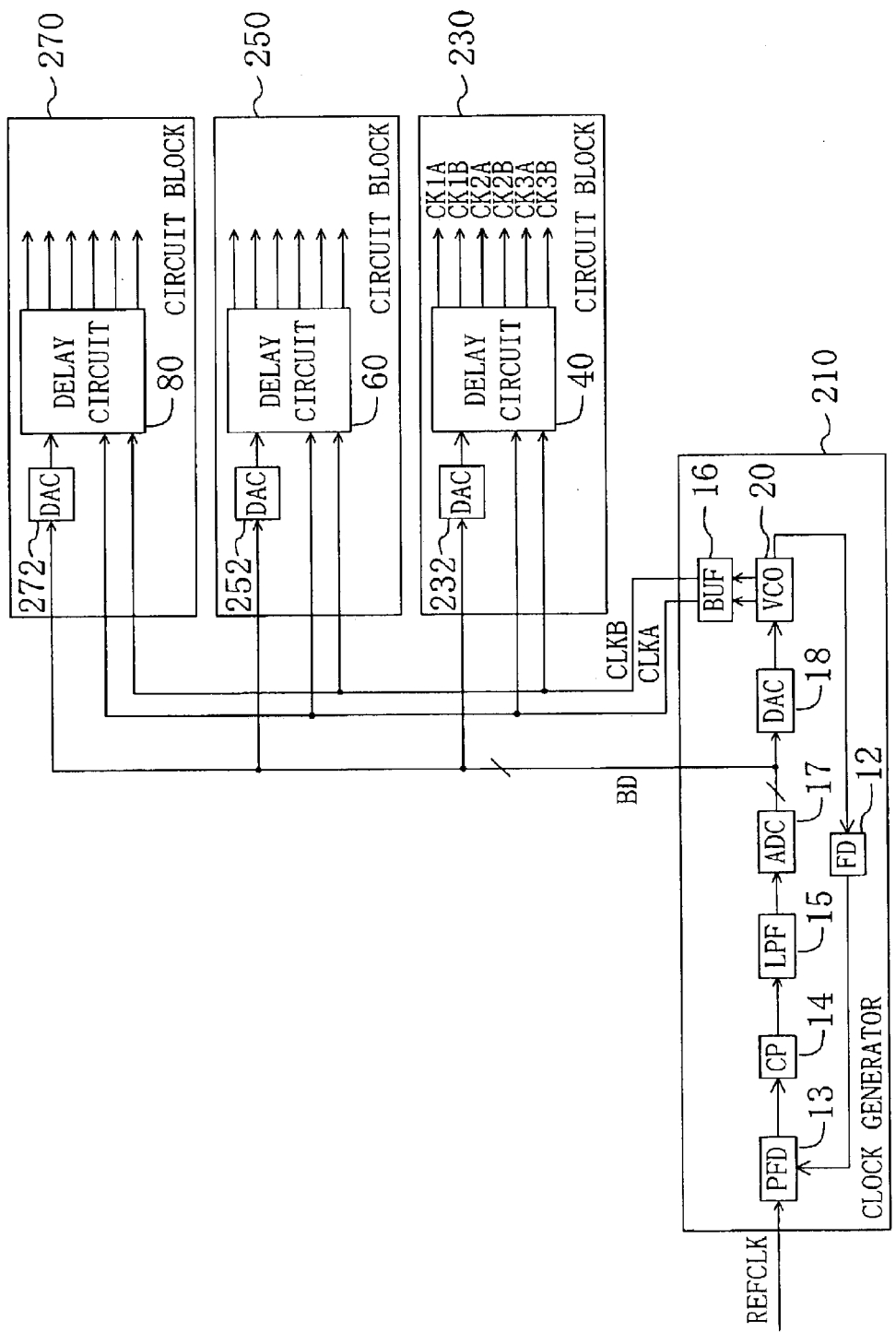
FIG. 9 is a block diagram of a semiconductor integrated circuit having a multi-phase clock transmission circuit of a third alteration to Embodiment 1 of the present invention.

FIG. 9 is a block diagram of a semiconductor integrated circuit having a multi-phase clock transmission circuit of the third alteration to Embodiment 1. In general, the line for transmitting the control signal BA is long and high in resistance. The control signal BA is therefore susceptible to noise, and this may cause failure of matching of the delay amount in one delay element between the clock generator and the circuit block. To avoid occurrence of this trouble, in this alteration, the control signal BA is digitized before being transmitted.

The multi-clock transmission circuit of FIG. 9 includes a clock generator 210 and circuit blocks 230, 250 and 270. The clock generator 210 includes an analog-digital converter (ADC) 17 and a digital-analog converter (DAC) 18 in addition to the components of the clock generator 10 in FIG. 1. The circuit blocks 230, 250 and 270 include DACs 232, 252 and 272 in addition to the components of the circuit blocks 30, 50 and 70 in FIG. 1.

In the clock generator 210, the ADC 17 converts the control signal BA received from the low-pass filter 15 to a digital signal and outputs the resultant control signal BD to the DAC 18 and the DACs 232, 252 and 272 in the circuit blocks. The DAC 18 converts the received control signal BD to an analog signal and outputs the resultant signal to the VCO 20. Accordingly, the clock generator 210 operates as a PLL in substantially the same manner as the clock generator 10.

In the circuit block 230, the DAC 232 converts the received digitized control signal BD to an analog signal and outputs the resultant signal, as an equivalent of the control signal BA in FIG. 1, to the delay circuit 40. Likewise, the DACs 252 and 272 convert the control signal BD to an analog signal and output the resultant signal to the delay circuits 60 and 80, respectively. As for the other aspects, this alteration is the same as the multi-phase clock transmission circuit of FIG. 1.

The VCO 20 and the delay circuits 40, 60 and 80 may adopt delay elements that use a digital signal for control of the delay, and in this case, the DACs 18, 232, 252 and 272 are unnecessary.

The output from the low-pass filter 15 may otherwise be converted to a current signal, not a digital signal. In this case, a voltage-current conversion circuit may be provided in place of the ADC 17, and current-voltage conversion circuits may be provided in place of the DACs 18, 232, 252 and 272, so that the converted current signal as the control signal is transmitted to the current-voltage conversion circuits.

(Fourth Alteration to Embodiment 1)

Figure 10:
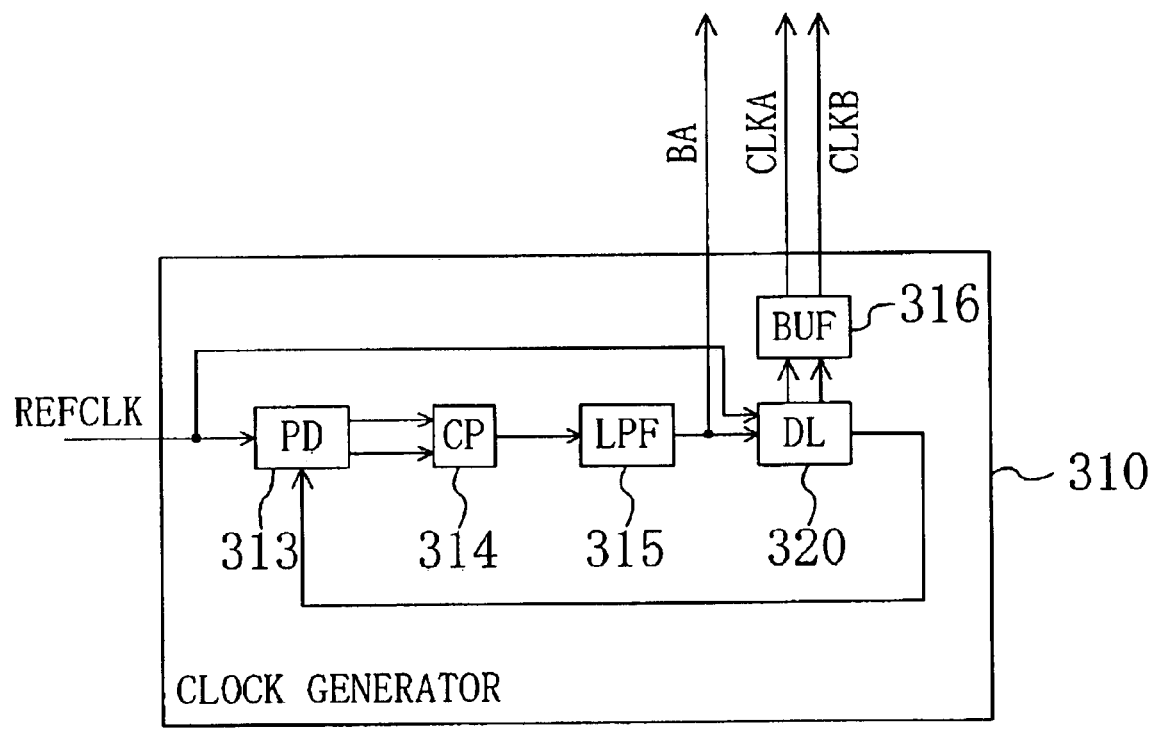
FIG. 10 is a block diagram of a clock generator of a multi-clock transmission circuit of a fourth alteration to Embodiment 1 of the present invention.

FIG. 10 is a block diagram of a clock generator 310 of a multi-phase clock transmission circuit of the fourth alteration to Embodiment 1. The multi-phase clock transmission circuit of FIG. 1 may be provided with this clock generator shown in FIG. 10 in place of the clock generator 10 of the PLL type.

The clock generator 310 includes a phase detector (PD) 313, a charge pump (CP) 314, a low-pass filter (LPF) 315, a buffer (BUF) 316 and a delay circuit (DL) 320 as a clock generation circuit. The phase detector 313 and the charge pump 314 operate as a phase comparison circuit. The phase detector 313, the charge pump 314, the low-pass filter 315 and the delay circuit 320 of the clock generator 310 constitute a delay locked loop (DLL).

The phase detector 313 compares phases between a signal output from the delay circuit 320 and an input reference clock REFCLK, and outputs a signal responsive to the resultant phase difference to the charge pump 314. The charge pump 314 outputs a voltage responsive to the received phase difference to the low-pass filter 315 as the result of comparison by the phase comparison circuit. The low-pass filter 315 outputs the low-frequency component of the input voltage to the delay circuit 320 as a control signal BA.

The delay circuit 320 gives a delay according to the control signal BA to the reference clock REFCLK and outputs the resultant clock to the phase detector 313 and the buffer 316. The clock output from the delay circuit 320 to the buffer 316 is a differential signal. The buffer 316 operates in substantially the same manner as the buffer 16 in FIG. 1. The low-pass filter 315 outputs the control signal BA also to the delay circuits 40, 60 and 80.

Figure 11:
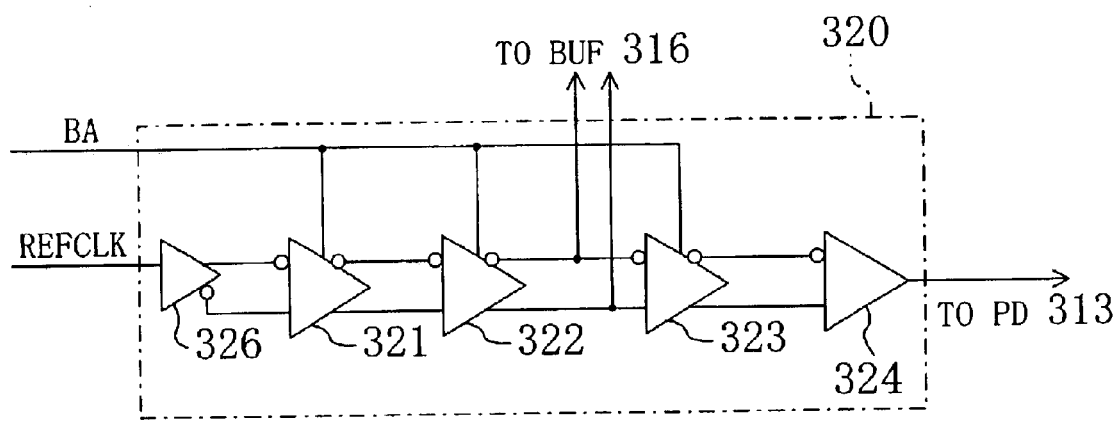
FIG. 11 is a circuit diagram of an example of a delay circuit in FIG. 10.

FIG. 11 is a circuit diagram of an example of the delay circuit 320 shown in FIG. 10. The delay circuit 320 includes delay elements 321, 322 and 323 and buffers 324 and 326. The delay elements 321 to 323 are substantially identical to the delay elements 21 to 23 in FIG. 2, and individually receive the control signal BA. The delay elements 321 to 323 are differential buffers, for example, and are in cascade connection. The buffer 324 is substantially identical to the buffer 24 in FIG. 2.

Referring to FIG. 11, the buffer 326 converts the single-ended reference clock REFCLK to a differential signal and outputs the differential signal to the delay element 321. The delay element 323 supplies its output to the buffer 324, which is then supplies its output to the phase detector 313. The delay element 322, for example, supplies its output to the buffer 316.

As described above, the clock generator 310 changes the control signal BA so that the phase of the output signal from the delay circuit 320 matches with that of the reference clock REFCLK, to thereby achieve feedback control of the delay circuit 320. The clock generator 310 can be used for an application in which the frequency of a multi-phase clock to be transmitted is the same as that of the reference clock REFCLK.

Embodiment 2

When the distance between the clock generator and a circuit block is long, the properties of transistors are likely to vary between the two components, and also the power supply potential and the ground potential applied to the two components are likely to be inconsistent. In such an occurrence, as in the case described above, the delay amount in one delay element may fail to match between the clock generator and the circuit block. In this embodiment, to avoid this problem, a circuit for correcting a delay is provided for the delay circuit.

Figure 12:
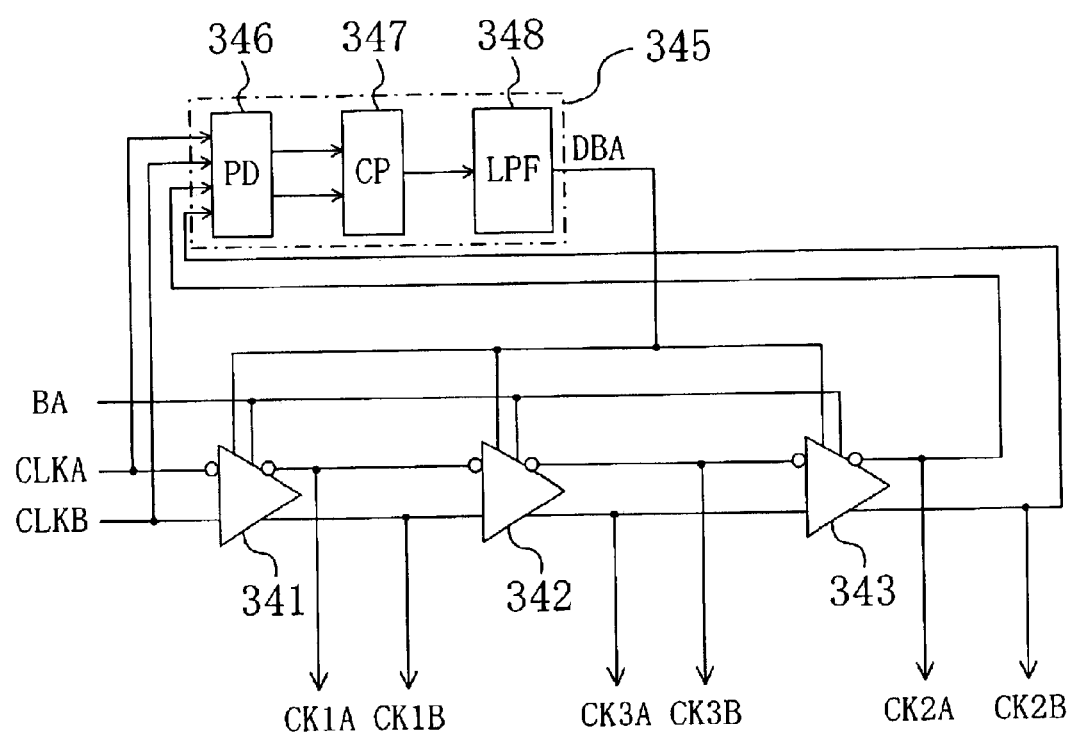
FIG. 12 is a circuit diagram of a delay circuit of a multi-phase clock transmission circuit of Embodiment 2 of the present invention.

FIG. 12 is a circuit diagram of a delay circuit of a multi-phase clock transmission circuit of Embodiment 2 of the present invention. The delay circuit of FIG. 12 is different from the delay circuit 40 of FIG. 3 in that delay elements 341, 342 and 343 are provided in place of the delay elements 41, 42 and 43 and a delay correction circuit 345 is additionally provided. The delay correction circuit 345 includes a phase detector (PD) 346, a charge pump (CP) 347 and a low-pass filter (LPF) 348.

Each of the delay elements 341 to 343 is a differential buffer, for example, as the delay element 21 and the like, and has a positive input terminal, a negative input terminal, a positive output terminal and a negative output terminal. The delay elements 341 to 343, which are in cascade connection as shown in FIG. 12, individually receive a delay correction signal DBA output from the delay correction circuit 345, in addition to the control signal BA. Each of the delay elements 341 to 343 gives a delay according to the control signal BA and the delay correction signal DBA to signals input at its input terminals, and outputs the resultant signals.

The delay generated in each of the delay elements 341 to 343 is roughly one-sixth of the period TCLK of the clock CLKA/CLKB, as in the delay circuit of FIG. 3. Therefore, the phase of a clock CK2A/CK2B output from the delay element 343 is shifted by about $\pi$ from that of the clock CLKA/CLKB input into the delay element 341. In consideration of this, the delay correction circuit 345 generates the delay correction signal DBA in accordance with the difference between the phase difference between the two clocks and the value $\pi$, and outputs the signal DBA to the delay elements 341 to 343.

The phase detector 346 compares phases between the clock CLKA/CLKB and a phase-reversed clock of the clock CK2A/CK2B, and outputs a signal responsive to the resultant phase difference to the charge pump 347. The charge pump 347 outputs a voltage responsive to the phase difference detected by the phase detector 346 to the low-pass filter 348. The low-pass filter 348 outputs the low-frequency component of the input voltage to the delay elements 341 to 343 as the delay correction signal DBA. Each of the delay elements 341 to 343 changes the generated delay in accordance with not only the control signal BA but also the delay correction signal DBA in such a manner as to reduce the phase difference to be detected by the phase detector 346.

As described above, in the multi-clock transmission circuit having the delay circuit of FIG. 12, the delay elements are controlled with the control signal BA output from the clock generator and the delay correction signal DBA generated in accordance with the clock generated by the delay circuit. With this feedback control of the delay elements with the delay correction signal DBA, a delay to be generated if the delay elements are controlled only with the control signal BA can be corrected to an appropriate value with the delay correction signal DBA. This makes it possible to correct an error of the delay in the delay element that may occur due to a process variation, inconsistency of the power supply potential and the ground potential and the like.

(Alteration to Embodiment 2)

Figure 13:
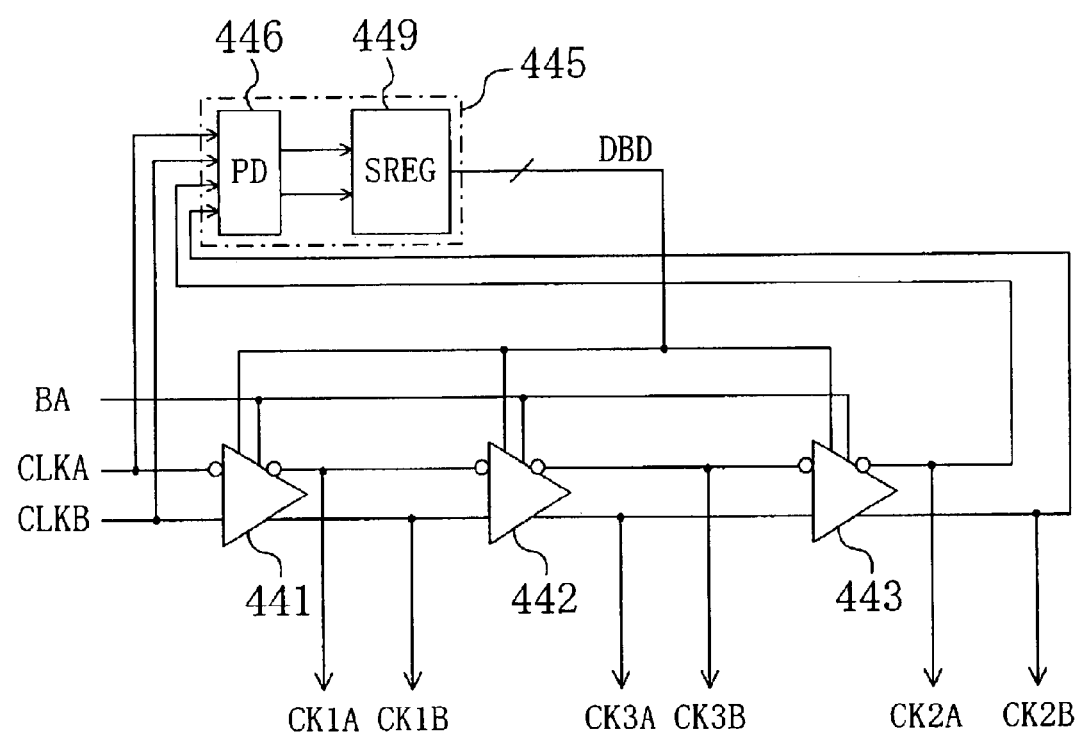
FIG. 13 is a circuit diagram of a delay circuit of a multi-phase clock transmission circuit of an alteration to Embodiment 2 of the present invention.

FIG. 13 is a circuit diagram of a delay circuit of a multi-phase clock transmission circuit of an alteration to Embodiment 2. The delay circuit of FIG. 13 includes delay elements 441, 442 and 443 and a delay correction circuit 445, in place of the delay elements 341, 342 and 343 and the delay correction circuit 345 of the delay circuit of FIG. 12. The delay correction circuit 445 includes a phase detector (PD) 446, which is substantially the same as the phase detector 346, and a shift register (SREG) 449.

The delay elements 441 to 443 are the same as the delay elements 341 to 343 except that they receive a digital delay correction signal DBD in place of the delay correction signal DBA. The delay elements 441 to 443 give a delay according to the control signal BA and the delay correction signal DBD to signals input at their input terminals and output the resultant signals. The delay correction signal DBD is an nb-bit (nb is an integer) digital signal in which one of the nb bits is active (for example, one bit is "1" while the other bits are "0"). The delay elements 441 to 443 change the delay by a value predetermined according to the position of the active bit.

The phase detector 446 detects the phase difference between the clock CLKA/CLKB and a phase-reversed clock of the clock CK2A/CK2B, and outputs a signal responsive to the resultant phase difference to the shift register 449. For example, the phase detector 446 outputs to the shift register 449 a signal instructing rightward shift when the phase of the clock CK2A/CK2B leads the phase of the clock CLKA/CLKB and leftward shift in the reverse case.

The shift register 449 shifts the active bit in accordance with the phase difference detected by the phase detector 446, and outputs the resultant delay correction signal DBD to the delay elements 441 to 443. Each of the delay elements 441 to 443 changes the delay generated therein in such a manner as to reduce the phase difference to be detected by the phase detector 446.

In Embodiment 2 and the alteration to Embodiment 2, the delay in each of the delay elements of the delay circuits of FIGS. 12 and 13 is controlled with the control signal BA so as to be considerably close to the delay in the delay elements of the clock generator. Therefore, it is unnecessary to widely change the delay generated in the delay elements of the delay circuit with the delay correction signal DBA or DBD.

In Embodiment 2 and the alteration to Embodiment 2, the phase difference was detected between the input clock CLKA/CLKB and the clock of which the phase difference with the clock CLKA/CLKB should be π. Alternatively, the phase difference may be detected using another combination of two clocks as long as the phase difference between the two clocks is detectable. In other words, the phases of any two clocks among the clock CLKA/CLKB and the clocks output from the delay elements 341 to 343 may be compared with each other.

In the above description, the phase difference was detected and automatically corrected within the delay circuit. Alternatively, the phase difference may be controlled outside the integrated circuit. Specifically, the clock generated in the delay circuit may be monitored outside the integrated circuit, and the delay correction signal may be provided from outside.

Embodiment 2 and the alteration to Embodiment 2 may be combined with any of the first to fourth alterations to Embodiment 1.

Embodiment 3

The above embodiments were related to the technology of retaining the frequency of clocks and the phase difference between the clocks in each of circuit blocks. In Embodiment 3, a technology of attaining matching of the phases of clocks with one another across different circuit blocks will be described. For example, in transmitting the clock CKDA/CKDB to the circuit blocks via buffers as shown in FIG. 8, the clocks received by the circuit blocks fail to match in phase with one another. This problem occurs because the distances from the clock generator to the circuit blocks are different from one another and the number of buffers through which the clock passes is different among the circuit blocks.

Figure 14:
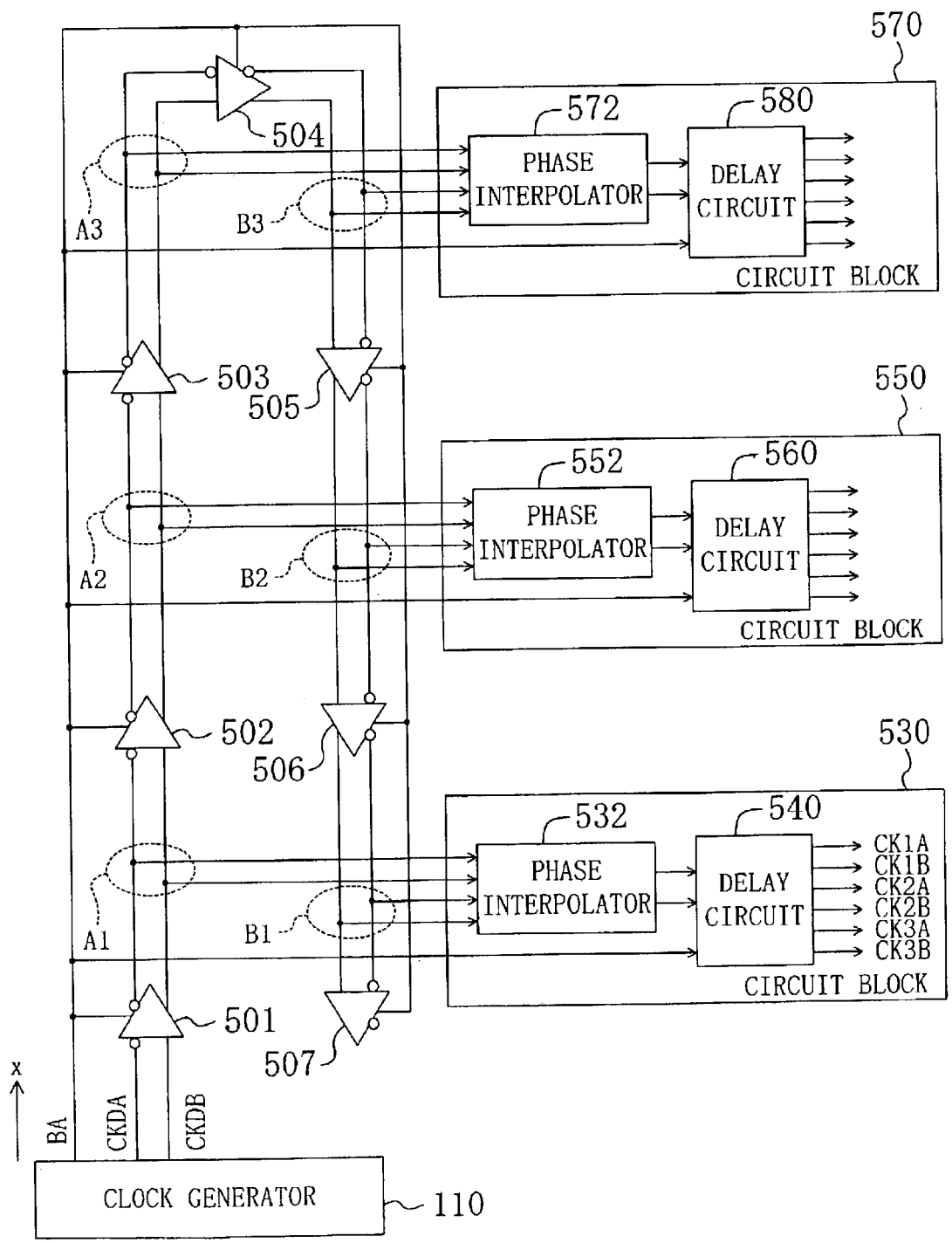
FIG. 14 is a block diagram of a semiconductor integrated circuit having a multi-phase clock transmission circuit of Embodiment 3 of the present invention.

FIG. 14 is a block diagram of a semiconductor integrated circuit having a multi-phase clock transmission circuit of Embodiment 3 of the present invention. Referring to FIG. 14, the multi-phase clock transmission circuit includes the clock generator 110 shown in FIG. 8, buffers 501, 502, 503, 504, 505, 506 and 507, phase interpolators 532, 552 and 572, and delay circuits 540, 560 and 580.

The buffers 501 to 507 have substantially the same properties as the delay element 21 and the like, and individually receive the control signal BA. The delay circuits 540, 560 and 580 are substantially the same as the delay circuits 40, 60 and 80 in FIG. 1. The phase interpolator 532 and the delay circuit 540 are included in a circuit block 530, the phase interpolator 552 and the delay circuit 560 are included in a circuit block 550, and the phase interpolator 572 and the delay circuit 580 are included in a circuit block 570. The circuit blocks 530, 550 and 570 individually perform signal processing using a multi-phase clock.

The lines for transmitting the clock CKDA/CKDB have a first portion running from the clock generator 110 to the buffer 504 as the turning point and a second portion running from the buffer 504 toward the clock generator 110. The first portion includes branch points A1, A2 and A3 for branching to the phase interpolators 532, 552 and 572. The second portion includes branch points B1, B2 and B3 for branching to the phase interpolators 532, 552 and 572. The buffer 501, 502, 503 and 504 are placed on the line sections between the clock generator 110 and the branch point A1, between the branch points A1 and A2, between the branch points A2 and A3, and between the branch points A3 and B3, respectively. The buffers 505 and 506 are placed on the line sections between the branch points B3 and B2 and between the branch points B2 and B1. The buffer 507 is connected to the ends of the lines.

The length of the lines between the adjacent branch points A1 and A2 is equal to the length of the lines between the branch points B1 and B2 corresponding to the branch points A1 and A2. The length of the lines between the adjacent branch points A2 and A3 is equal to the length of the lines between the branch points B2 and B3 corresponding to the branch points A2 and A3.

The phase interpolator 532 receives a clock transmitted via lines branching at the branch point A1 and a clock transmitted via lines branching at the branch point B1. The phase interpolator 532 changes the level of its output signals at substantially the midpoint between two timings at which these two clocks respectively change the level, and outputs the resultant signals to the corresponding delay circuit 540.

Likewise, the phase interpolator 552 receives a clock transmitted via lines branching at the branch point A2 and a clock transmitted via lines branching at the branch point B2.

The phase interpolator 572 receives a clock transmitted via lines branching at the branch point A3 and a clock transmitted via lines branching at the branch point B3. The phase interpolators 552 and 572 operate as does the phase interpolator 532, and output the resultant signals to the delay circuits 560 and 580, respectively.

Figure 15:
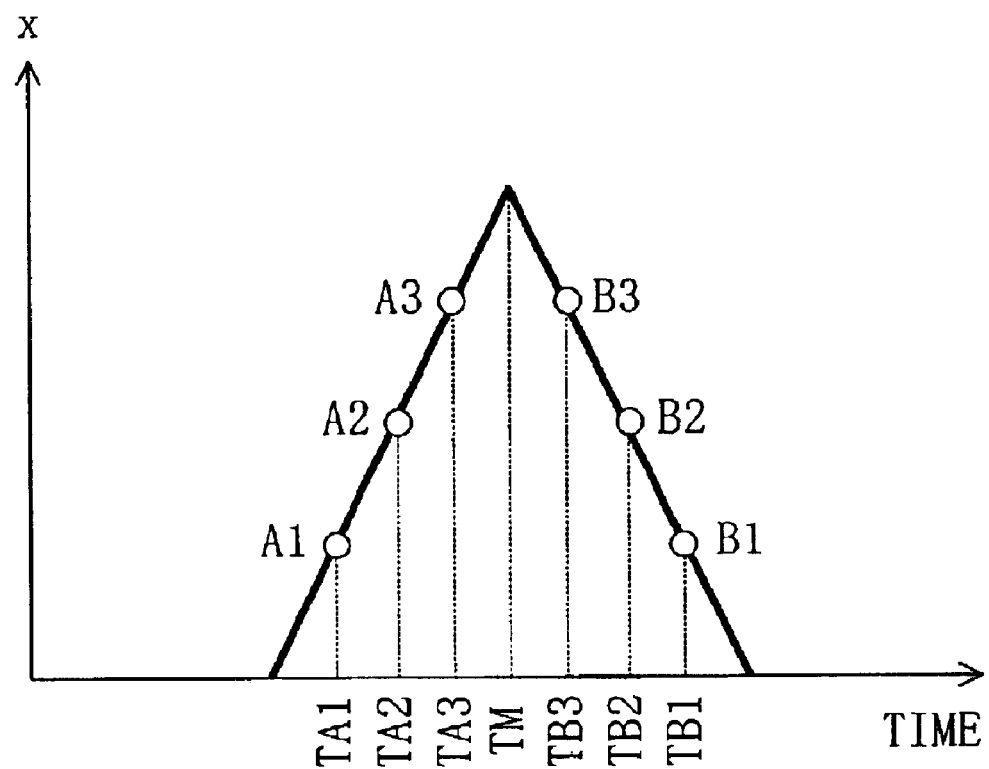
FIG. 15 is a graph showing examples of times at which a clock reaches branch points.

FIG. 15 is a graph showing examples of times at which a clock reaches the branch points. That is, FIG. 15 conceptually shows the relationship between the coordinate x and the time at which a certain level change of the clock CKDA/CKDB reaches a branch point (the x-axis is directed from the clock generator 110 toward the buffer 504).

Assume that the times at which a certain level change of the clock reaches the branch points A1, A2 and A3 are TA1, TA2 and TA3, respectively, and the times at which the certain level change of the clock reaches the branch points B1, B2 and B3 are TB1, TB2 and TB3, respectively. Assume also that the midpoint between the times TA3 and TB3 is TM=(TA3+TB3)/2.

One buffer is placed between every adjacent branch points. Therefore, the times required for transmission of a signal through the line section between the adjacent branch points A1 and A2 and the line section between the adjacent branch points B1 and B2 are substantially the same. Likewise, the times required for transmission of a signal through the line section between the adjacent branch points A2 and A3 and the line section between the adjacent branch points B2 and B3 are substantially the same. That is, in FIG. 15, equation (1) below is satisfied.

$$TA2-TA1=TB1-TB2 \quad (1)$$

When a time TM1 at which a level change appears in the clock output from the phase interpolator 532 is (TA1+TB1)/2, a time TM2 at which the level change appears in the clock output from the phase interpolator 552 is (TA2+TB2)/2. From the equation (1), TM1=TM2. Likewise, for a time TM3 at which the level change appears in the clock output from the phase interpolator 572, TM2=TM3=TM.

As described above, all of the phase interpolators 532, 552 and 572 change the level of the output clock at the time TM. In other words, the phase interpolators 532, 552 and 572 output the clocks substantially matching in phase with one another. Thus, the circuit blocks 530, 550 and 570 can use a multi-phase clock having substantially no time difference among the circuit blocks.

To consider differently, the following argument may also be adopted. That is, as for the phase interpolator 532, two buffers are placed on the line section from the branch point A1 to the buffer 504 and on the line section from the buffer 504 to the branch point B1. Assuming that the lengths of the two line sections are substantially the same, the times required for transmission of a clock through the two line sections are substantially the same. When the midpoint between the time at which a level change is input into the buffer 504 and the time at which the level change is output from the buffer 504 is TM, TM−TA1=TB1−TM. Therefore, the time at which the level change appears in the clock output from the phase interpolator 532 is (TA1+TB1)/2=TM.

Likewise, as for the phase interpolator 552, assuming that the times required for transmission of a clock through the line section from the branch point A2 to the buffer 504 and the line section from the buffer 504 to the branch point B2 are substantially the same, TM−TA2=TB2−TM. Therefore, the time at which a level change corresponding to the level change output from the phase interpolator 532 at the time TM appears in the clock output from the phase interpolator 552 is (TA2+TB2)/2=TM.

As for the phase interpolator 572, Assuming that the times required for transmission of a clock through the line section from the branch point A3 to the buffer 504 and the line section from the buffer 504 to the branch point B3 are substantially the same, TM−TA3=TB3−TM. Therefore, the time at which a level change corresponding to the level change output from the phase interpolator 532 at the time TM appears in the clock output from the phase interpolator 572 is (TA3+TB3)/2=TM.

Thus, all of the phase interpolators 532, 552 and 572 change the level of the output at the time TM. In other words, the phase interpolators 532, 552 and 572 output the clocks substantially matching in phase with one another.

The same effect can be obtained without provision of the buffers 501 to 507 if it is ensured for each phase interpolator that the two line sections between the two corresponding branch points and the turning point have substantially the same length.

In the embodiments described above, differential buffers were used as the delay elements. Alternatively, buffers for a single-ended signal may be used when the clock is a single-ended signal.

Although three circuit blocks each having a delay circuit were shown in the above description, any number of circuit blocks may be used.

The frequency of the clock output from the multi-phase transmission circuit of the present invention is 1 GHz, for example, or may be higher than 1 GHz. The higher the frequency of the clock is, the greater the effect of suppressing inter-clock skew of the present invention is. In particular, a greater effect is obtained when the frequency of the clock is 1 GHz or higher.

In the above embodiments, transmission of a 3-phase clock was described. Likewise, a 2-phase clock, a 4-phase clock, or a clock with phases more than four can also be easily transmitted.

As described above, according to the present invention, it is possible to implement a multi-phase clock transmission circuit capable of supplying a multi-phase clock while suppressing inter-clock skew and stabilizing the frequency.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A multi-phase clock transmission circuit comprising:
a clock generator for generating a clock which synchronizes with a reference clock and which has a frequency equal to an integral multiple of a frequency of the reference clock, and for generating a control signal responsive to a phase difference between the reference clock and the clock, the clock generator comprising a clock generation circuit including at least one delay element for giving a delay according to the control signal to an input signal and outputting the clock,
at least one delay circuit for generating a multi-phase clock based on the clock and the control signal, the delay circuit comprising a plurality of delay elements in cascade connection each giving a delay according to the control signal to an input signal and outputting the multi-phase clock,
wherein each of the plurality of delay elements of the delay circuit controls the delay to be given to the input signal in accordance with a delay correction signal in addition to the control signal.

2. The multi-phase clock transmission circuit of claim 1, wherein the delay circuit further comprises a delay correction circuit receiving two signals among the signals output from the plurality of delay elements in cascade connection and the clock, for generating the delay correction signal in accordance with a difference between a phase difference between the received two signals and a predetermined value and outputting the delay correction signal.

3. The multi-phase clock transmission circuit of claim 2, wherein the delay correction circuit outputs the delay correction signal as a digital signal.

4. The multi-phase clock transmission circuit of claim 1, wherein the delay correction signal is input from outside a semiconductor integrated circuit including the multi-phase clock transmission circuit.

5. A multi-phase clock transmission circuit comprising:

a clock generator for generating a clock which synchronizes with a reference clock and which has a frequency equal to an integral multiple of a frequency of the reference clock, and for generating a control signal responsive to a phase difference between the reference clock and the clock, the clock generator comprising a clock generation circuit including at least one delay element for giving a delay according to the control signal to an input signal and outputting the clock, at least one delay circuit for generating a multi-phase clock based on the clock and the control signal, the delay circuit comprising a plurality of delay elements in cascade connection each giving a delay according to the control signal to an input signal and outputting the multi-phase clock, at least one buffer circuit, said at least one buffer circuit coupled to said at least one delay circuit, wherein said at least one buffer circuit changes the amplitude of the clock to a predetermined value and outputs the resultant clock to said delay circuit.

6. The multi-phase clock transmission circuit of claim 5, wherein the buffer circuit includes a delay element having substantially the same properties as the delay elements of the delay circuit.

7. A multi-phase clock transmission circuit comprising:

a clock generator for generating a clock which synchronizes with a reference clock and which has a frequency equal to an integral multiple of a frequency of the reference clock and for generating a control signal responsive to a phase difference between the reference clock and the clock, the clock generator comprising a clock generation circuit including at least one delay element for giving a delay according to the control signal to an input signal and outputting the clock, at least one delay circuit for generating a multi-phase clock based on the clock and the control signal, the delay circuit comprising a plurality of delay elements in cascade connection each giving a delay according to the control signal to an input signal and outputting the multi-chase clock, a buffer for changing the amplitude of the clock to a predetermined value, the buffer being placed on a line for transmission of the clock at a position between a branch point for branching to the delay circuit and the clock generator.

8. The multi-phase clock transmission circuit of claim 7, wherein the buffer includes a delay element having substantially the same properties as the delay element of the clock generation circuit.

9. A multi-phase clock transmission circuit comprising:

a clock generator for generating a clock which synchronizes with a reference clock and which has a frequency equal to an integral multiple of a frequency of the reference clock and for generating a control signal responsive to a phase difference between the reference clock and the clock, the clock generator comprising a clock generation circuit including at least one delay element for generating a delay according to the control signal to an input signal and outputting the clock, at least one delay circuit for generating a multi-phase clock based on the clock and the control signal, the delay circuit comprising a plurality of delay elements in cascade connection each having a delay according to the control signal to an input signal and outputting the multi-phase clock, an analog-digital conversion circuit for converting the control signal to a digital signal and outputting a resultant signal; and a digital-analog conversion circuit provided in correspondence with the delay circuit for converting the transmitted digitized control signal to an analog signal and outputting a resultant signal to the delay circuit.

10. A multi-phase clock transmission circuit comprising:

a clock generator for generating a clock which synchronizes with a reference clock and has a frequency equal to an integral multiple of a frequency of the reference clock and a control signal responsive to a phase difference between the reference clock and the clock, the clock generator comprising a clock generation circuit including at least one delay element for giving a delay according to the control signal to an input signal and outputting the clock, at lease one delay circuit for generating a multi-phase clock based on the clock and the control signal, the delay circuit comprising a plurality of delay elements in cascade connection each giving a delay according to the control signal to an input signal and outputting the multi-phase clock, wherein more than one delay circuit is provided, and wherein the multi-phase clock transmission circuit further comprises a plurality of phase interpolators placed in correspondence with the plurality of delay circuits, a line for transmission of the clock has a first portion from the clock generator to a turning point and a second portion from the turning point toward the clock generator, and has first and second branch points for branching to each of the phase interpolators in the first and second portions, respectively, each of the phase interpolators receives two signals via lines branching at the first and second branch points, changes the level of an output signal at substantially the midpoint between two timings at which the two signals respectively change the level, and outputs the resultant signal to the corresponding delay circuit as the clock, and the multi-phase clock transmission circuit is configured so that the times required for transmission of the signal through a line section between two adjacent branch points among the first branch points and a line section between the two branch points among the second branch points corresponding to the two adjacent first branch points are substantially equal to each other.

11. The multi-phase clock transmission circuit of claim 10, further comprising a buffer in the same number on the line section between two adjacent first branch points and on the line section between the two second branch points corresponding to the two adjacent first branch points.

12. The multi-phase clock transmission circuit of claim 10, wherein the length of the line section between two adjacent first branch points and the length of the line section between the two second branch points corresponding to the two adjacent first branch points are substantially equal to each other.

* * * * *